United States Patent
Kwon et al.

(10) Patent No.: US 9,831,104 B1
(45) Date of Patent: Nov. 28, 2017

(54) TECHNIQUES FOR MOLDED UNDERFILL FOR INTEGRATED CIRCUIT DIES

(71) Applicant: Xilinx, Inc., San Jose, CA (US)

(72) Inventors: Woon-Seong Kwon, Cupertino, CA (US); Suresh Ramalingam, Fremont, CA (US)

(73) Assignee: XILINX, INC., San Jose, CA (US)

(*) Notice: Subject to any disclaimer, the term of this patent is extended or adjusted under 35 U.S.C. 154(b) by 0 days.

(21) Appl. No.: 14/935,011

(22) Filed: Nov. 6, 2015

(51) Int. Cl.
*H01L 21/56* (2006.01)
*H01L 21/67* (2006.01)
*H01L 23/31* (2006.01)

(52) U.S. Cl.
CPC .......... *H01L 21/563* (2013.01); *H01L 21/565* (2013.01); *H01L 21/67126* (2013.01); *H01L 23/3142* (2013.01)

(58) Field of Classification Search
CPC ............................ H01L 21/563; H01L 21/565; H01L 21/67126
See application file for complete search history.

(56) References Cited

U.S. PATENT DOCUMENTS

| | | | |
|---|---|---|---|
| 5,998,243 A * | 12/1999 | Odashima | B29C 45/14655 257/E21.503 |
| 6,344,162 B1 * | 2/2002 | Miyajima | B29C 43/18 264/272.14 |
| 7,518,398 B1 | 4/2009 | Rahman et al. | |
| 8,089,299 B1 | 1/2012 | Rahman et al. | |
| 8,415,783 B1 | 4/2013 | Rahman et al. | |
| 8,546,955 B1 | 10/2013 | Wu | |
| 2002/0019072 A1* | 2/2002 | Kobayashi | H01L 21/561 438/107 |
| 2006/0001158 A1* | 1/2006 | Matayabas, Jr. | H01L 23/3128 257/738 |
| 2009/0079052 A1* | 3/2009 | Youn | H01L 21/566 257/678 |
| 2009/0230409 A1* | 9/2009 | Basin | H01L 33/54 257/88 |
| 2010/0120222 A1* | 5/2010 | Kim | H01L 21/187 438/455 |
| 2011/0012149 A1* | 1/2011 | Basin | H01L 33/60 257/98 |
| 2013/0330880 A1* | 12/2013 | Dang | H01L 24/97 438/113 |

* cited by examiner

*Primary Examiner* — Peniel M Gumedzoe
(74) *Attorney, Agent, or Firm* — Joshua Hamberger; Carleton Clauss (57) ABSTRACT

Techniques for providing a unified underfill and encapsulation for integrated circuit die assemblies. These techniques include a molding technique that includes dipping a die assembly including a substrate and one or more dies into a chamber having molding material, sealing the chamber, and lowering pressure in the chamber to coax the molding material into space between the die(s) and substrate. The use of this molding technique, as contrasted with a capillary underfill technique in which underfill material is laid down adjacent dies and fills space under the die via capillary action, provides several benefits. One benefit is that the molding material can include a higher silica particle filler content (% by weight) than the material for the capillary underfill technique, which improves CTE. Another benefit is that various design constraints related to, for example, warpage and partial underfill are eliminated or improved.

13 Claims, 5 Drawing Sheets

TECHNIQUES FOR MOLDED UNDERFILL FOR INTEGRATED CIRCUIT DIES

TECHNICAL FIELD

Examples of the present disclosure generally relate to integrated circuit packaging and, in particular, to techniques for molded underfill for integrated circuit dies.

BACKGROUND

Integrated circuit ("IC") packages typically include dies coupled to a substrate. In conventional IC packages, to fill gaps between dies and a substrate in order to provide mechanical support, a gap-filling underfill material is provided. The gap-filling underfill material is made to occupy the gaps via capillary action. Specifically, the gap-filling underfill material is deposited adjacent the dies and flows to the space under the dies via capillary action.

There are many issues with this type of underfill process. One example of an issue is that there is a design trade-off between viscosity and coefficient of thermal expansion ("CTE") of the underfill material. Specifically, a lower CTE is generally desirable in many instances, and lowering CTE is achieved by increasing the percentage of silica filler particles in the underfill material. However, increasing the amount of silica filler particles increases viscosity of the underfill material. Above a certain viscosity, the underfill material will not properly flow under the dies via capillary action. Another example of an issue is that, due to the nature of the capillary underfill process, various die placement constraints must be observed. For example, different types of dies may have a particular required clearance that may be unacceptably high. Additionally, dummy dies may need to be placed in order to mitigate the effects of warpage or other effects. The above issues present difficulties in designing and manufacturing die packaging.

SUMMARY

A method is provided. The method includes attaching a carrier wafer of a die assembly, the carrier wafer being attached to a substrate on which one or more dies are disposed, to a mold tool top portion. The method also includes moving the die assembly to a chamber including a molding material. The method further includes sealing the mold tool top portion against mold tool side portions. The method also includes applying a vacuum to the chamber to coax the molding material into spaces defined between the one or more dies and the substrate.

A die assembly is provided. The die assembly includes a substrate. The die assembly also includes one or more conductive pillars disposed on the substrate. The die assembly further includes one or more dies disposed on the one or more conductive pillars. The die assembly also includes a gap-filling mold encapsulation formed continuously in space between the one or more dies and the substrate and to the side of the one or more dies.

A mold encapsulator is provided. The mold encapsulator includes a top plate operable to attach to a carrier wafer of a die assembly. The mold encapsulator also includes a bottom plate operable to support molding material. The mold encapsulator further includes a mold tool side wall operable to form a chamber with the bottom plate. The mold encapsulator also includes a vacuum pump operable to create a vacuum within the chamber to coax molding material into space between a substrate and a die of the die assembly when the die assembly is brought into the chamber.

BRIEF DESCRIPTION OF THE DRAWINGS

So that the manner in which the above recited features can be understood in detail, a more particular description, briefly summarized above, may be had by reference to example implementations, some of which are illustrated in the appended drawings. It is to be noted, however, that the appended drawings illustrate only typical example implementations and are therefore not to be considered limiting in scope.

To facilitate understanding, identical reference numerals have been used, where possible, to designate identical elements that are common to the figures. It is contemplated that elements of one example may be beneficially incorporated in other examples.

DETAILED DESCRIPTION

Various features are described hereinafter with reference to the figures. It should be noted that the figures may or may not be drawn to scale and that the elements of similar structures or functions are represented by like reference numerals throughout the figures. It should be noted that the figures are only intended to facilitate the description of the features. They are not intended as an exhaustive description of the claimed invention or as a limitation on the scope of the claimed invention. In addition, an illustrated embodiment need not have all the aspects or advantages shown. An aspect or an advantage described in conjunction with a particular embodiment is not necessarily limited to that embodiment and can be practiced in any other embodiments even if not so illustrated, or if not so explicitly described.

Disclosed herein are techniques for providing a gap-filling enclosure that serves as both underfill and encapsulation for integrated circuit assemblies. A molding technique is provided that includes dipping a die assembly having one or more dies attached to a substrate into a chamber having molding material, sealing the chamber, and lowering pressure in the chamber to coax the molding material into space between the die(s) and substrate. The use of this molding technique, as contrasted with a capillary underfill technique in which underfill material is laid down adjacent to dies and fills space under the dies via capillary action, provides several benefits. One benefit is that the molding material can include a higher silica particle filler content (% by weight) than the material for the capillary underfill technique, which improves the coefficient of thermal expansion ("CTE"). This increase in particle filler content is possible because the molding technique does not rely on capillary action to cause the molding material to enter the space between the dies and the substrate. Another benefit is that various design constraints that would otherwise have to be followed and that are related to die placement are improved upon.

Figure 1A:
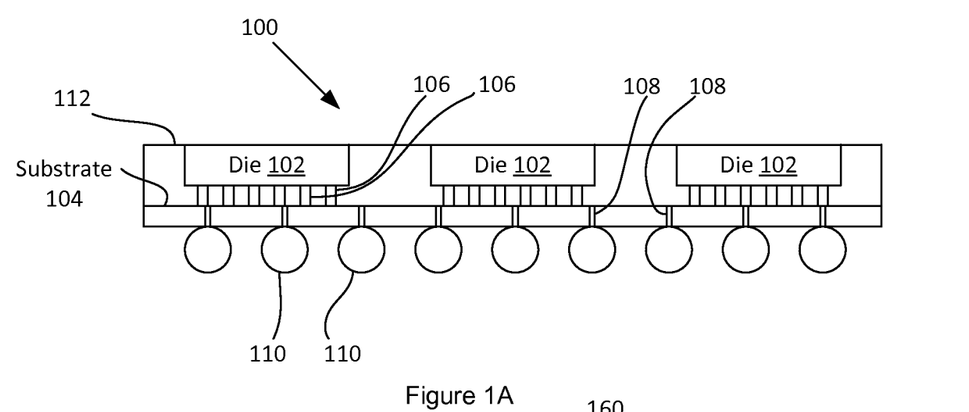
FIG. 1A illustrates an integrated circuit package, according to an example.

FIG. 1A illustrates an integrated circuit ("IC") package 100, according to an example. As shown, IC package 100 includes a plurality of dies 102 coupled to a substrate 104 via conductive pillars 106. Space between substrate 104, dies 102, and conductive pillars 106 (as well as space to the side of and in between dies 102) is filled with a molded gap-filling encapsulation 112.

Substrate 104 may be an interposer having a plurality of interconnections (not shown) for electrically connecting multiple dies 102 together. Substrate 104 has a plurality of through-silicon vias ("TSVs") 108 that provide electrical connections between dies 102 and a plurality of external electrical interconnections 110 (which may be controlled collapse chip connection (C4) bumps, microbumps, solder balls, or other connections suitable for signal transmission). Note that although TSVs 108 are shown extending through the substrate 104, any particular TSV 108 may instead terminate at an internal interconnection instead of traveling through substrate 104. The conductive pillars 106 may be formed on a top surface of substrate 104, for example, by a suitable deposition technique such as electroplating, physical vapor deposition, screen printing, or inkjet printing, among others. The distal ends of the conductive pillars 106 may be planarized or otherwise processed to provide a uniform planar surface. The conductive pillars 106 may extend about 60 to 80 μm from the substrate 104.

In conventional IC packages, to fill gaps between dies and a substrate, a gap-filling underfill material is provided in a capillary underfill process. Subsequently, a mold encapsulation is provided to encapsulate the underfilled dies. Thus, conventional IC packages include separate underfill and encapsulation components.

By contrast, the IC package 100 includes a single molded gap-filling encapsulation 112 that fills gaps between dies 102 and substrate 104 and also encapsulates the dies 102. This molded gap-filling encapsulation 112 provides many benefits as compared with the separate underfill and mold encapsulation technique that is conventionally used.

Figure 1B:
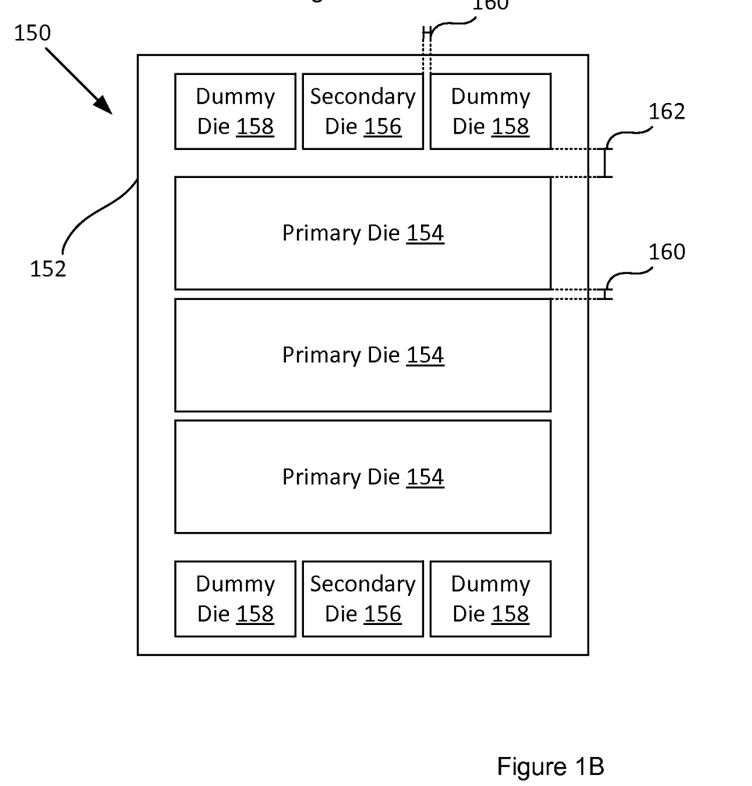
FIG. 1B illustrates an integrated circuit package, according to an example.

One benefit is that die arrangements on a substrate are not as constrained as with the separate underfill process. FIG. 1B illustrates an integrated circuit package 150, according to an example. The integrated circuit package 150 illustrates some of the die placement constraints associated with the conventional capillary underfill process.

The integrated circuit package 150 includes a substrate 152 on which main dies 154, secondary dies 156, and dummy dies 158 are disposed. Main dies 154 may include, for example, configurable logic devices such as field programmable gate arrays having configurable elements for forming desired circuitry. Secondary dies 156 include other dies providing additional functionality and may include microcontrollers, application specific integrated circuits and other dies. Dummy dies 158 include dies that do not include substantial functional circuitry but instead serve to provide mechanical support and/or prevent warpage as discussed below.

Several design constraints associated with the capillary underfill are process are now described. A die-to-die spacing 160 is shown. Die-to-die spacing 160 may indicate minimum distance between dies of the same type (such as primary dies 154 or secondary dies 156). A die-to-die gap 162 for dies that are not substantially similar is also shown. This die-to-die gap 162 is larger than the die-to-die spacing 160 between dies that are substantially similar due to the nature of the capillary underfill process. Specifically, during the underfill process, when the underfill material is deposited adjacent to dies (such as dies 154), this material is drawn through the space under the dies by capillary action to fill that space. If other, non-similar dies were too close to the dies for which the underfill is provided, then some of the underfill material may, by capillary action, be drawn to the space under those non-similar dies. This action may cause the space under those non-similar dies to be only partially filled with underfill material, leading to a non-desirable partial die underfill. The die-to-die gap 162 is provided to ensure such partial die underlining does not occur. In addition, dummy dies 158 are included to occupy area that, if unoccupied, could lead to undesirable amounts of warping. Warpage that is too high would decrease performance of such robotic machinery and/or may cause such machinery to fail. The warpage issue is greater in embodiments of integrated circuit package 150 where a silicon interposer (e.g., 104) is thin or even non-existent. Note that the die-to-die spacing 160 and die-to-die gap 162 limitations exist in part due to the warpage concerns.

Improved techniques are thus provided herein for providing the structural support of an underfill material and also improving or eliminating the design constraints discussed above. In general, this is accomplished using a molding technique, rather than a capillary underfill technique, to fill the space between dies and substrate. Instead of providing underfill and encapsulation in two separate operations (as was done previously), a single operation provides both underfill and encapsulation. Because of the nature of this molding technique, the composition of the underfill material can be changed as compared with prior compositions, to produce certain benefits such as improved coefficient of thermal expansion matching. Another benefit is that only a single step for both underfill and encapsulation is needed, which improves the manufacturing process.

Additionally, the molded underfill techniques provided herein reduces or eliminates warpage of the integrated circuit package 150 ("chip-on-wafer warpage"). Chip-on-wafer warpage is an important parameter with respect to the robotic machinery that handles the wafers during manufacturing. Warpage that is too high would decrease performance of such robotic machinery and/or may cause such machinery to fail. Techniques for molded underfill and encapsulation reduce or eliminate warpage, and are now described.

Figure 2:
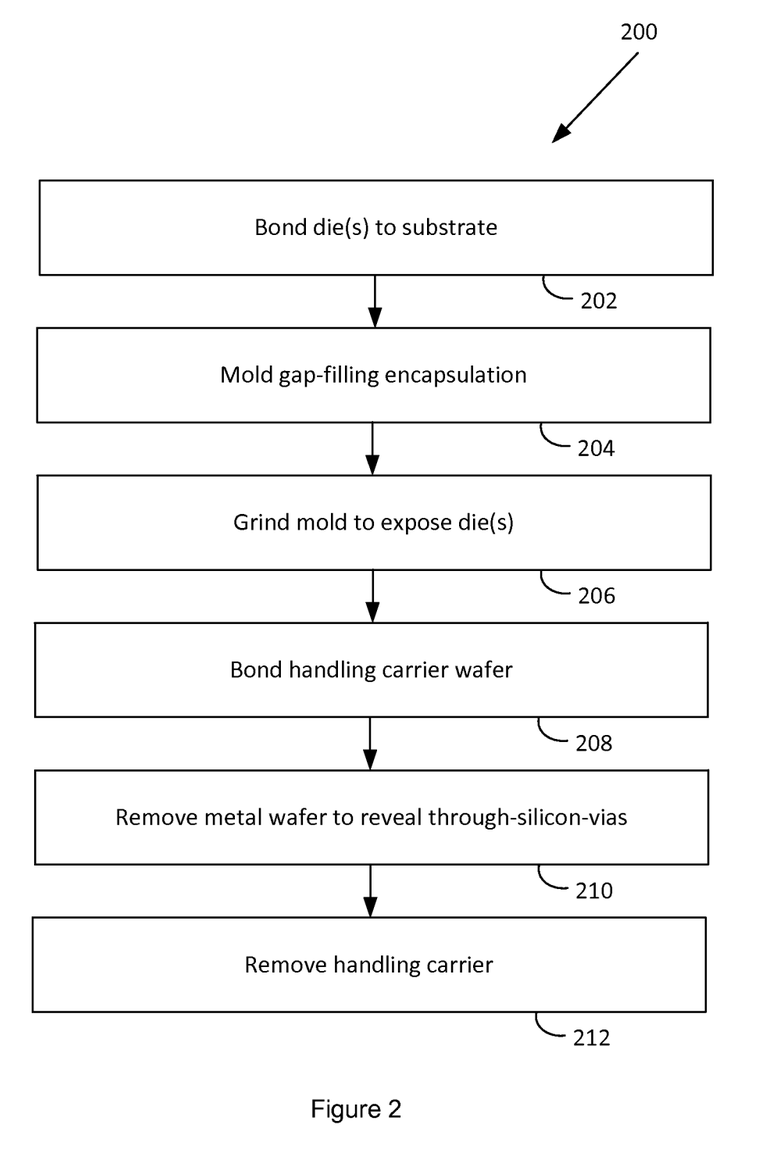
FIG. 2 is a flow diagram of die packaging technique, according to an example.

FIGS. 2 and 3A-3G illustrate an overall flow for a die packaging technique that includes generating a molded gap-filling encapsulation. FIG. 2 is a flow diagram of a method 200 for the die packaging technique, according to an example, and FIGS. 3A-3G are diagrams of selected operations associated with method 200, according to an example. Although particular steps are described and particular operations and components are shown and described as being associated with those steps, those of skill in the art will recognize that various modifications can be made to the method and to the components. For example, operations of the method 200 may be performed in various technically feasible orders and the placement, number, composition, and configuration of various elements (such as the dies, substrate 104, molded gap-filling encapsulation 112, and the like) may vary from what is illustrated and described. The die packaging technique will now be described with reference to FIGS. 2 and 3A-3G together. Note that the operations shown and described may be performed by an appropriate packaging apparatus that includes the mold encapsulator 400 illustrated in FIGS. 4A and 4B.

As shown, method 200 begins at operation 202 (FIG. 3A), where a packaging apparatus bonds a substrate 104 having dies 102 disposed thereon to a carrier wafer 304 for handling. Note that the substrate 104 already has, attached thereto, the conductive pillars 106 and the dies 102 attached to the conductive pillars 106. At the end of operation 202, wafer 304 is bonded to this structure. The purpose of the carrier wafer 304 is to allow for handling by the packaging apparatus and is detached at a later step. The carrier wafer 304 may be a metal wafer or may be any other material that allows for handling by the parts of the packaging apparatus.

Figure 3A:
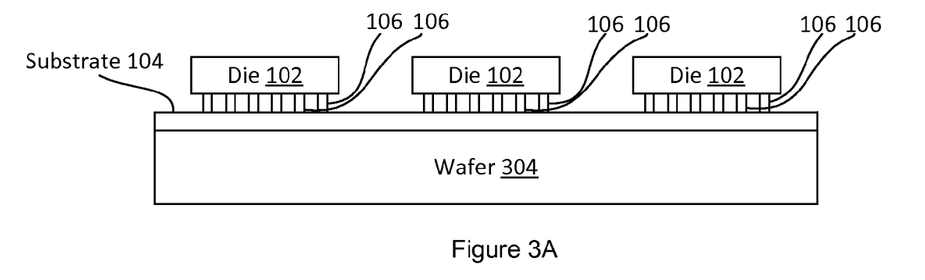
FIGS. 3A-3G are diagrams of selected operations associated with the method of FIG. 2, according to an example.
Figure 3B:
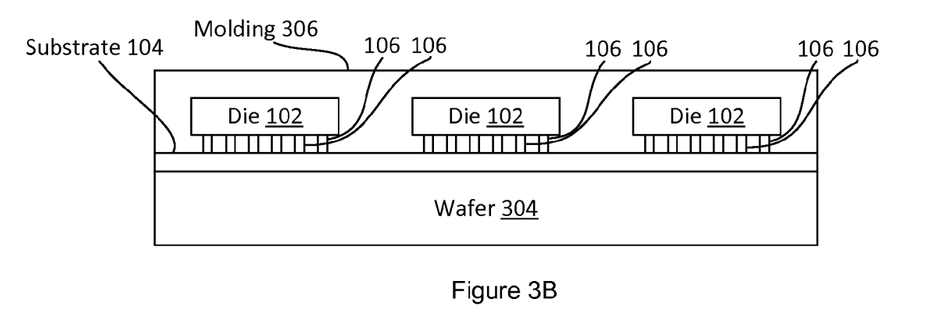

At operation 204, mold encapsulator 400 of the packaging apparatus encapsulates dies 102 in a gap-filling mold material using a molding process. This operation includes holding the assembly (i.e., carrier wafer 304, substrate 104, and dies 102) via the carrier wafer 304, dipping the dies 102 in molding material, and creating a vacuum (via a vacuum pump, not shown) to coax the molding material into the spaces between the dies 102 and the substrate 104, as well as around and above the dies 102 to form molding 306 as shown in FIG. 3B. As can be seen, molding 306 extends into the spaces between dies 102 and substrate 104 and may extend above the dies 102 as shown. Thus, as shown in FIG. 3B, after operation 204, the die assembly includes substrate 104, to which dies 102 are attached via conductive pillars 106, molding 306 under, around, and above dies 102, and carrier wafer 304 attached to a side of substrate 104 opposite dies 102. Additional details for operation 204 are described below with respect to FIGS. 4A and 4B.

At operation 206 (FIG. 3C), the packaging apparatus grinds the molding 306 down to expose the dies. At this point, molding 306 (which may be equivalent or similar to molded gap-filling encapsulation 112) extends into the space under the dies 102 and around the dies 102 but not above the top surfaces of the dies 102. Thus, as shown in FIG. 3B, the die assembly is similar to the die assembly in FIG. 3B, but the molding 306 is ground down to expose top surfaces of dies 102.

Figure 3C:
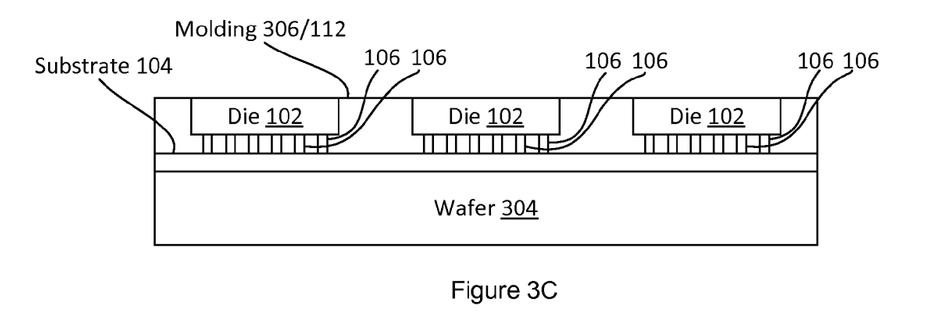

At operation 208 (FIG. 3D), the packaging apparatus attaches a handling carrier 308 to the top surface of the molding 306 and dies 102 for further processing. Thus, in FIG. 3D, the die assembly is similar to what is shown in FIG. 3C, except that a handling carrier 308 is attached to the top surface of dies 102 and molding 306.

Figure 3D:
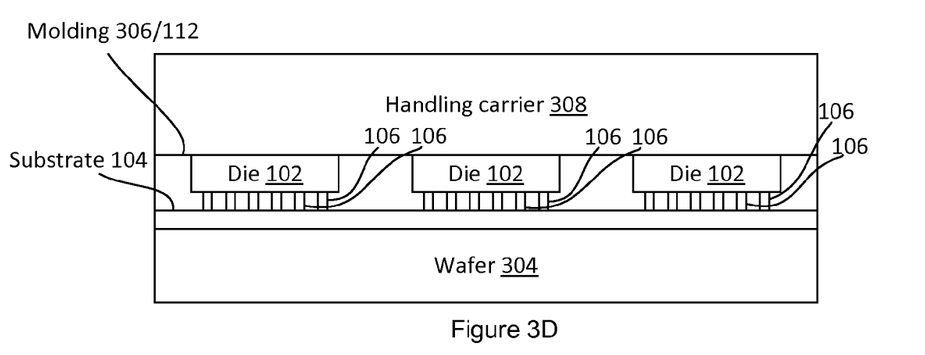
Figure 3E:
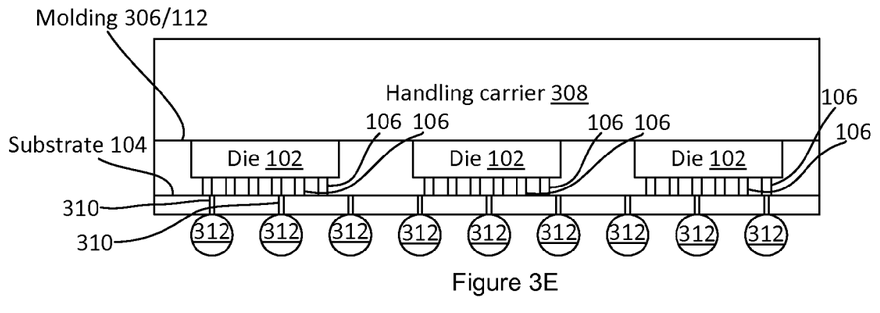
Figure 3F:
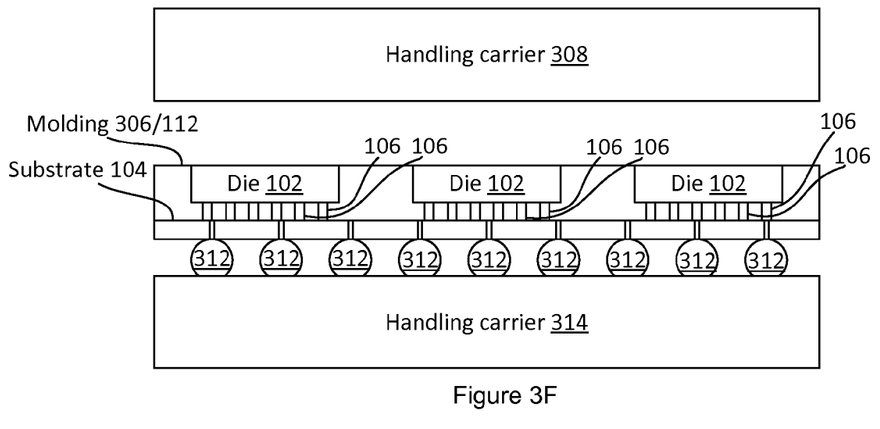

At operation 210 (FIG. 3E), the packaging apparatus removes the wafer 304 to expose through-silicon-vias ("TSVs") 310 in the bottom surface of substrate 104. Note that the TSVs 310 are shown schematically and do not necessarily extend all the way through substrate 104. For example, TSVs 310 may be coupled internally to connections that connect one die 102 to a different die 102, or to other types of connections. At operation 208, connectors 312, which may be microbumps, C4 balls, or the like, and which provide conductive connection between substrate 104 and other components may be attached. Thus, after operation 210, as shown in FIG. 3E, die assembly is similar to what is shown in FIG. 3D, except that carrier wafer 304 is removed and connectors 312 are shown as attached. Note that although TSVs 310 are shown in FIG. 3E and not in the other figures (e.g., FIGS. 3A-3D), TSVs 310 may be present in die assembly at the stages represented by those other figures.

Figure 3G:
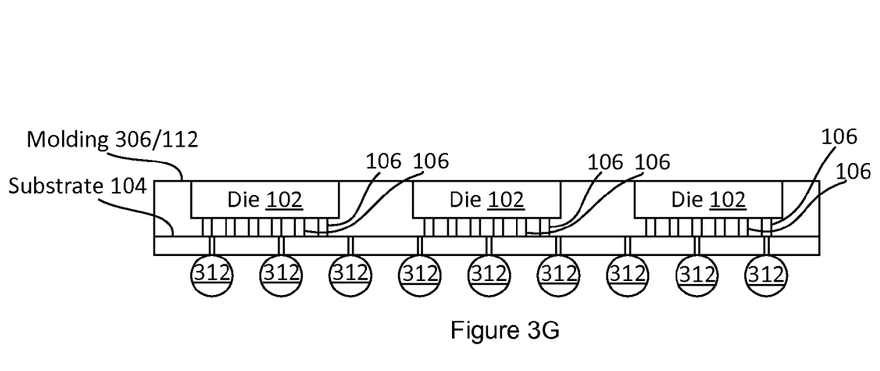

At operation 212 (FIG. 3F), packaging apparatus removes handling carrier 314, leaving the encapsulated dies coupled to the substrate 104. FIG. 3G shows the last stage of the die assembly in the die packaging technique described with respect to FIG. 2. Thus the die assembly in FIG. 3G is similar to that shown in FIG. 1. Note that the connectors 312 are similar to external electrical interconnections 110 of FIG. 1.

Wafer 304, handling carrier 308, and handling carrier 314, may be a glass or silicon material and may have a shape similar to substrate 104, but with a slightly larger surface area.

Figure 4A:
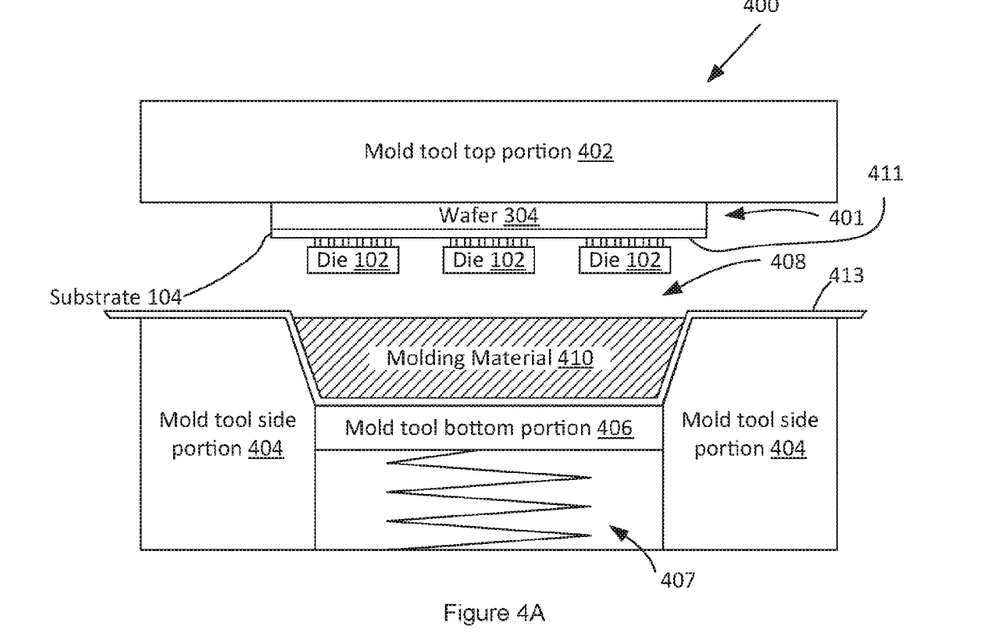
FIGS. 4A-4B illustrate a mold encapsulator and operations for applying a mold encapsulation to a die assembly via the mold encapsulator, according to an example.
Figure 4B:
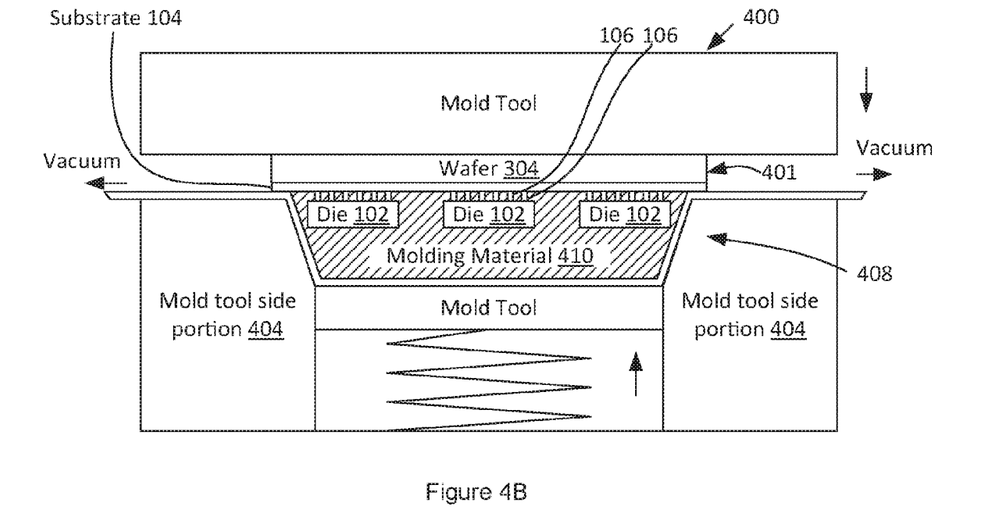

FIGS. 4A-4B illustrate a mold encapsulator 400 and operations for applying a mold encapsulation to a die assembly 401 via the mold encapsulator 400, according to an example. These operations may be included within operation 204 of method 200, described above. As shown, mold encapsulator 400 includes a mold tool top portion 402 that attaches to wafer 304 of the die assembly 401 shown in FIG. 3A. Mold encapsulator 400 also includes mold tool side portion 404 and mold tool bottom portion 406 that define a chamber 408 into which molding material 410 is placed. A platform actuator 407 (which may be embodied as any of a variety of components for raising or lower mold tool bottom portion 406, such as a motor, or the like) is operable to raise and lower mold tool bottom portion 406. The molding material 410 includes an organic polymer and an inorganic filler. When cured, the organic polymer hardens, solidifying into an encapsulation molding. The molding material 410 is discussed in further detail below. A release film 413 is placed over the mold tool bottom portion 406 to allow for release of the die assembly 401 after being dipped in molding material 410.

As shown in FIG. 4B, once the die assembly 401, including the wafer 304, substrate 104, and dies 102, is attached to mold tool top portion 402, mold tool top portion 402 is lowered to dip die assembly 401 into molding material 410. A vacuum is then applied to chamber 408. The chamber 408 may be sealed via an appropriate sealing mechanism such as with a rubber lining or gasket or similar object. Note that only the top surface 411 of die assembly is in contact with molding material 410 because the diameter of wafer 304 is larger than the opening size of chamber 408, thus preventing wafer 304 from being lowered past the top of mold tool side portion 404. This vacuum pushes molding material 410 into the space present among the conductive pillars 106 and between dies 102 and substrate 104 in order to provide mechanical support to die assembly 401 and provide various functionality such as warpage prevention and the like. After this, molding material 410 is cured and hardens into molding 306. Molding material 410 may be cured via pressure or in a vacuum oven, with post-anneal curing also possible. Die assembly 401 may be removed from chamber 408 with the help of release film 413.

Because a molding technique, rather than a capillary technique, is used, molding material 410 has different material properties than molding materials commonly used for capillary underfill. More specifically, molding material includes an epoxy that hardens when cured and a filler material typically comprising silica particles. The molding material has various properties that are affected by the composition. For example, as the percentage by weight of silica filler increases, the coefficient of thermal expansion ("CTE," typically expressed in parts per million per degree Celsius or PPM/° C.) decreases. Additionally, as the percentage by weight of silica filler increases, the viscosity of the composition increases. At a certain percentage by weight of silica filler, the viscosity begins increasing dramatically. Viscosity past a certain point is undesirable for the capillary underfill process because such material will not sufficiently flow into the space underneath dies. However, it is frequently desirable to reduce the CTE of the underfill material in order to match that of other elements of die assemblies, such as silicon components and to reduce warpage. A low CTE value also reduces post-cure warpage, which helps lower residual stress and improve material toughness in confined geometries. As is clear, for the capillary underfill process, there are conflicting material property desires—CTE must be traded off for viscosity.

With the molded underfill process described herein, however, this tradeoff is less critical. More specifically, because of the vacuum pressure applied, even a higher viscosity underfill material will sufficiently flow into under-die gaps and fill the spaces between conductive pillars 106. Thus, more silica particles can be added to the underfill material for the molding technique described herein. One example composition of molding material includes 80-85% of silica filler particles by weight. This molding material would have approximately 6-8 ppm/° C. (optionally approximately 6.5 ppm/° C.), which is an improvement over capillary techniques using a material having approximately 20-25 ppm/° C. In addition to having the % weight content as described, filler particles for the molding material for the molded underfill process may have a cut size of 3 microns and an average size of 1 micron. Cut size is a maximum filler particle size. Alumina particles may also be used in addition to silica particles.

The various examples described herein may employ various computer-implemented operations involving data stored in computer systems. For example, these operations may require physical manipulation of physical quantities—usually, though not necessarily, these quantities may take the form of electrical or magnetic signals, where they or representations of them are capable of being stored, transferred, combined, compared, or otherwise manipulated. Further, such manipulations are often referred to in terms, such as producing, identifying, determining, or comparing. Any operations described herein that form part of one or more example implementations may be useful machine operations. In addition, one or more examples also relate to a device or an apparatus for performing these operations. The apparatus may be specially constructed for specific required purposes, or it may be a general purpose computer selectively activated or configured by a computer program stored in the computer. In particular, various general purpose machines may be used with computer programs written in accordance with the teachings herein, or it may be more convenient to construct a more specialized apparatus to perform the required operations.

The various examples described herein may be practiced with other computer system configurations including handheld devices, microprocessor systems, microprocessor-based or programmable consumer electronics, minicomputers, mainframe computers, and the like.

One or more examples may be implemented as one or more computer programs or as one or more computer program modules embodied in one or more computer readable media. The term computer readable medium refers to any data storage device that can store data which can thereafter be input to a computer system—computer readable media may be based on any existing or subsequently developed technology for embodying computer programs in a manner that enables them to be read by a computer. Examples of a computer readable medium include a hard drive, network attached storage (NAS), read-only memory, random-access memory (e.g., a flash memory device), a Compact Disc (CD)-ROM, a CD-R, or a CD-RW, a DVD (Digital Versatile Disc), a magnetic tape, and other optical and non-optical data storage devices. The computer readable medium can also be distributed over a network coupled computer system so that the computer readable code is stored and executed in a distributed fashion.

While the foregoing is directed to specific example implementations, other and further example implementations may be devised without departing from the basic scope thereof, and the scope thereof is determined by the claims that follow.

What is claimed is:

1. A method, comprising:
attaching a carrier wafer of a die assembly, the carrier wafer being attached to a substrate on which one or more dies are disposed, to a mold tool top portion;
moving the die assembly to a chamber including a molding material;
sealing the chamber, wherein the chamber comprises a mold tool bottom portion disposed between mold tool side portions, each of the mold tool side portions comprising a respective side surface facing the chamber, wherein the respective side surfaces are slanted relative to the carrier wafer, and wherein a platform actuator is configured to at least one of raise and lower the mold tool bottom portion relative to the mold tool side portions;
adjusting a position of the mold tool bottom portion using the platform actuator, wherein the molding material is coaxed into spaces defined between the one or more dies and the substrate; and
disposing a release sheet operable to separate cured molding material on the respective side surfaces of the mold tool side portions and the mold tool bottom portion before sealing the chamber.

2. The method of claim 1, further comprising:
adding the molding material to the chamber, the molding material having a coefficient of thermal expansion of between approximately 6 parts per million per degree Celsius and approximately 8 parts per million per degree Celsius.

3. The method of claim 1, further comprising:
adding the molding material to the chamber, the molding material having a weight percentage composition of silica filler material of between approximately 80 percent and 85 percent.

4. The method of claim 1, further comprising:
causing the molding material to cure.

5. The method of claim 1, further comprising:
grinding the molding material to expose the one or more dies.

6. The method of claim 1, further comprising:
bonding the carrier wafer to the substrate.

7. The method of claim 6, wherein:
bonding the carrier wafer to the substrate comprises bonding the carrier wafer to the substrate that comprises an interposer that includes one or more through-silicon-vias and one or more die-to-die interconnects.

8. The method of claim 1, further comprising:
removing the carrier wafer to expose the substrate.

9. The method of claim 1, further comprising:
adding external interconnects to the substrate.

10. The method of claim 1, further comprising:
adding the molding material to the chamber, the molding material having a coefficient of thermal expansion of between approximately 6 parts per million per degree Celsius and approximately 8 parts per million per degree Celsius and a weight percentage composition of silica filler material of between approximately 80 percent and 85 percent, and wherein particles of the silica filler material have a maximum cut size of three microns.

11. A mold encapsulator, comprising:

a top plate operable to attach to a carrier wafer of a die assembly;

a bottom plate operable to support molding material;

mold tool side walls operable to form a chamber with the bottom plate, wherein the mold tool side walls are slanted relative to the top plate;

a platform actuator configured to at least one of raise and lower the bottom plate relative to the mold tool side wall, wherein the mold encapsulator is configured to coax molding material into space between a substrate and a die of the die assembly when the die assembly is brought into the chamber, wherein a release sheet operable to separate cured molding material is disposed on the mold tool side walls and the bottom plate.

12. The mold encapsulator of claim 11, wherein:

the top plate is movable to lower the die assembly into the chamber to dip the die assembly in the molding material.

13. The mold encapsulator of claim 11, wherein: the release sheet is operable to separate the cured molding material from the bottom plate and mold tool side wall.

* * * * *